United States Patent
Kazi et al.

(10) Patent No.: US 11,055,080 B2
(45) Date of Patent: Jul. 6, 2021

(54) SERIAL BOOTLOADING OF POWER SUPPLIES

(71) Applicant: HEWLETT PACKARD ENTERPRISE DEVELOPMENT LP, Houston, TX (US)

(72) Inventors: Rameez Kazi, Houston, TX (US); Daniel Humphrey, Houston, TX (US); Michael Miller, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/063,857

(22) PCT Filed: Jan. 13, 2016

(86) PCT No.: PCT/US2016/013260
§ 371 (c)(1),
(2) Date: Jun. 19, 2018

(87) PCT Pub. No.: WO2017/123220
PCT Pub. Date: Jul. 20, 2017

(65) Prior Publication Data
US 2018/0373524 A1    Dec. 27, 2018

(51) Int. Cl.
G06F 8/65 (2018.01)
G06F 1/26 (2006.01)
G11C 16/30 (2006.01)
G06F 1/30 (2006.01)

(52) U.S. Cl.
CPC .............. *G06F 8/65* (2013.01); *G06F 1/263* (2013.01); *G06F 1/30* (2013.01); *G11C 16/30* (2013.01)

(58) Field of Classification Search
CPC ... G06F 8/65; G06F 1/263; G06F 1/30; G11C 16/30
USPC ....................................................... 717/168
See application file for complete search history.

(56) References Cited

U.S. PATENT DOCUMENTS

| | | | |
|---|---|---|---|
| 5,835,761 A * | 11/1998 | Ishii etal. | G06F 8/65 713/100 |
| 6,504,131 B1 | 1/2003 | Hayes | |
| 7,992,076 B2 | 8/2011 | Raja | |
| 8,775,779 B2 | 7/2014 | Krieger et al. | |
| 8,782,633 B1 | 7/2014 | Tamilarasan et al. | |
| 2009/0172656 A1 | 7/2009 | Landry et al. | |

(Continued)

FOREIGN PATENT DOCUMENTS

WO    WO-2013147767 A1    10/2013

OTHER PUBLICATIONS

International Search Report and Written Opinion, International Application No. PCT/US2016/013260, dated Sep. 30, 2016, pp. 1-12, KIPO.

(Continued)

*Primary Examiner* — Wei Y Zhen
*Assistant Examiner* — Mohammed N Huda

(57) ABSTRACT

One example of a system includes a server, a plurality of power supplies, and a system controller. The plurality of power supplies are electrically coupled to the server and each power supply includes machine readable instructions. The system controller updates the machine readable instructions of each of the plurality of power supplies one at a time while maintaining power to the system controller from at least one of the plurality of power supplies.

15 Claims, 4 Drawing Sheets

(56) References Cited

U.S. PATENT DOCUMENTS

| | | | |
|---|---|---|---|
| 2011/0018854 A1* | 1/2011 | Barclay et al. ........... | G06F 1/30 |
| | | | 713/300 |
| 2011/0078435 A1* | 3/2011 | Krieger et al. ........... | G06F 8/65 |
| | | | 713/100 |
| 2011/0093843 A1* | 4/2011 | Endo et al. ............... | G06F 8/65 |
| | | | 717/170 |
| 2014/0112036 A1 | 4/2014 | Chen | |
| 2014/0208092 A1 | 7/2014 | Huang | |
| 2014/0298091 A1* | 10/2014 | Carlen et al. ............. | G06F 8/65 |
| | | | 714/15 |
| 2016/0379768 A1* | 12/2016 | Pham et al. ................ | G06F 1/30 |
| | | | 307/142 |

OTHER PUBLICATIONS

Silicon Graphics International Corp., "Origin200 and Origin200 GIGAchannel Owner's Guide," May 5, 1999, pp. 1-41.

* cited by examiner

SERIAL BOOTLOADING OF POWER SUPPLIES

BACKGROUND

A server in a computing system may include a power supply that converts AC line power to DC power suitable for operating the server. In some examples, a server may include redundant power supplies that maintain power to the server in the event of a failure of one of the power supplies. Each power supply may include firmware for controlling and monitoring the operations of the power supply.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

When the firmware of a power supply is updated, the power output of the power supply is turned off. Therefore, any device powered by the power supply may lose power during the update of the firmware. Accordingly, examples of the system described herein enable the serial update of the firmware of redundant power supplies such that any device powered by the redundant power supplies maintains power from at least one of the power supplies while the firmware of each power supply is updated.

Figure 1:
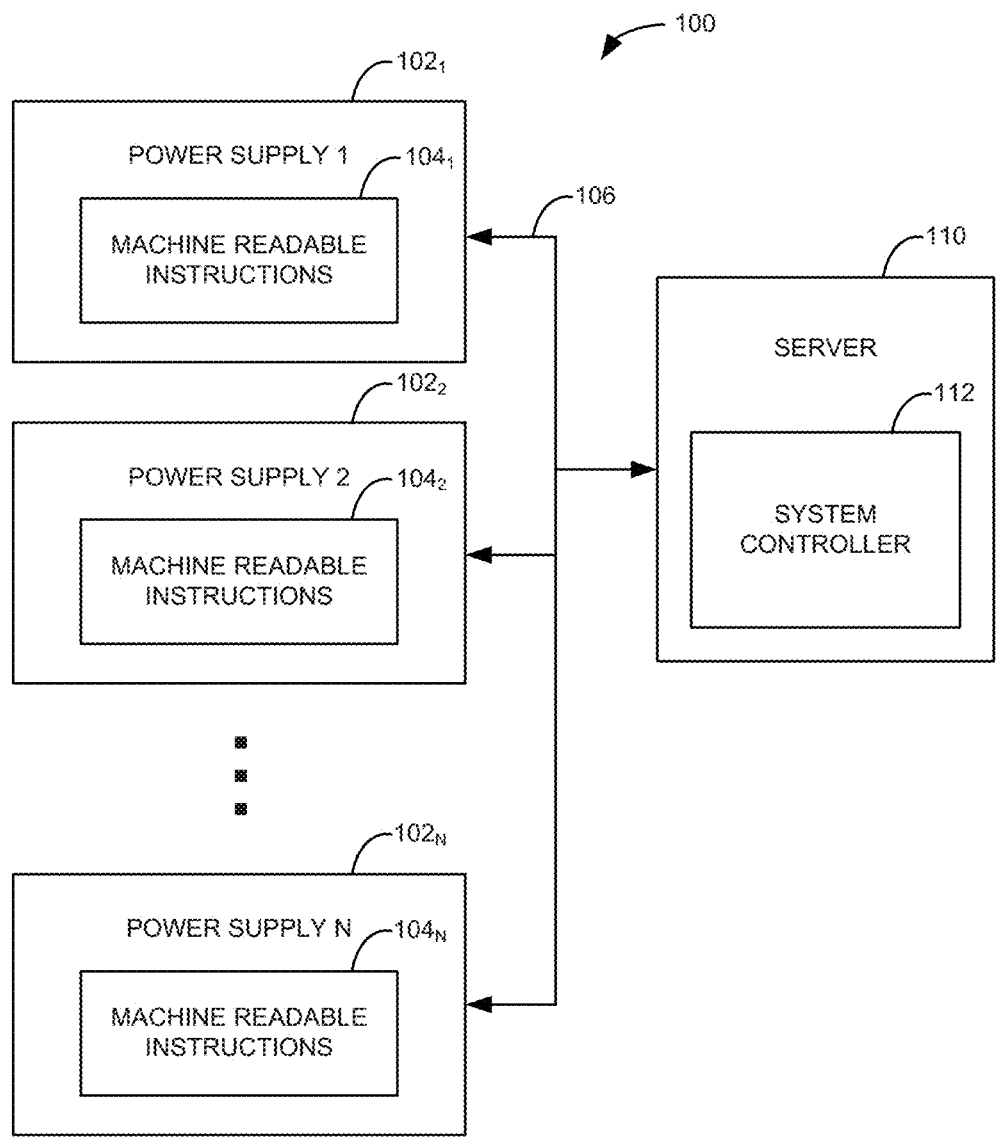
FIG. 1 is a block diagram illustrating one example of a system including redundant power supplies.

FIG. 1 is a block diagram illustrating one example of a system 100. System 100 includes a plurality of power supplies $102_1$ to $102_N$, where "N" is any suitable number of power supplies, and a server 110. Each power supply $102_1$ to $102_N$ includes machine readable instructions (e.g., firmware) $104_1$ to $104_N$ for controlling the operation and monitoring the status of each power supply $102_1$ to $102_N$, respectively. The machine readable instructions $104_1$ to $104_N$ are stored in a non-volatile memory of each power supply $102_1$ to $102_N$, respectively.

Server 110 includes a system controller 112 for controlling the update of the machine readable instructions of each power supply $102_1$ to $102_N$. Server 110 is electrically coupled to each power supply $102_1$ to $102_N$ as indicated at 106. Server 110 including system controller 112 receives power from each power supply $102_1$ to $102_N$ for operating server 110. System controller 112 also receives status information from each power supply $102_1$ to $102_N$ and sends data and control signals to each power supply $102_1$ to $102_N$ to control the update of the machine readable instructions of each power supply $102_1$ to $102_N$.

Power supplies $102_1$ to $102_N$ are redundant power supplies such that if one of power supplies $102_1$ to $102_N$ fails, the remaining power supplies may continue to provide power to server 110. When the machine readable instructions (e.g., firmware) of a power supply are updated, the power output of the power supply is turned off such that the power supply operates in a safe mode prior to allowing new machine readable instructions to overwrite the old machine readable instructions. To maintain power to system controller 112 during the update of the machine readable instructions of each power supply $102_1$ to $102_N$, system controller 112 updates the machine readable instructions of each power supply $102_1$ to $102_N$ one at a time. In this way, system controller 112 retains power from at least one of power supplies $102_1$ to $102_N$ during the machine readable instructions update process.

Figure 2:
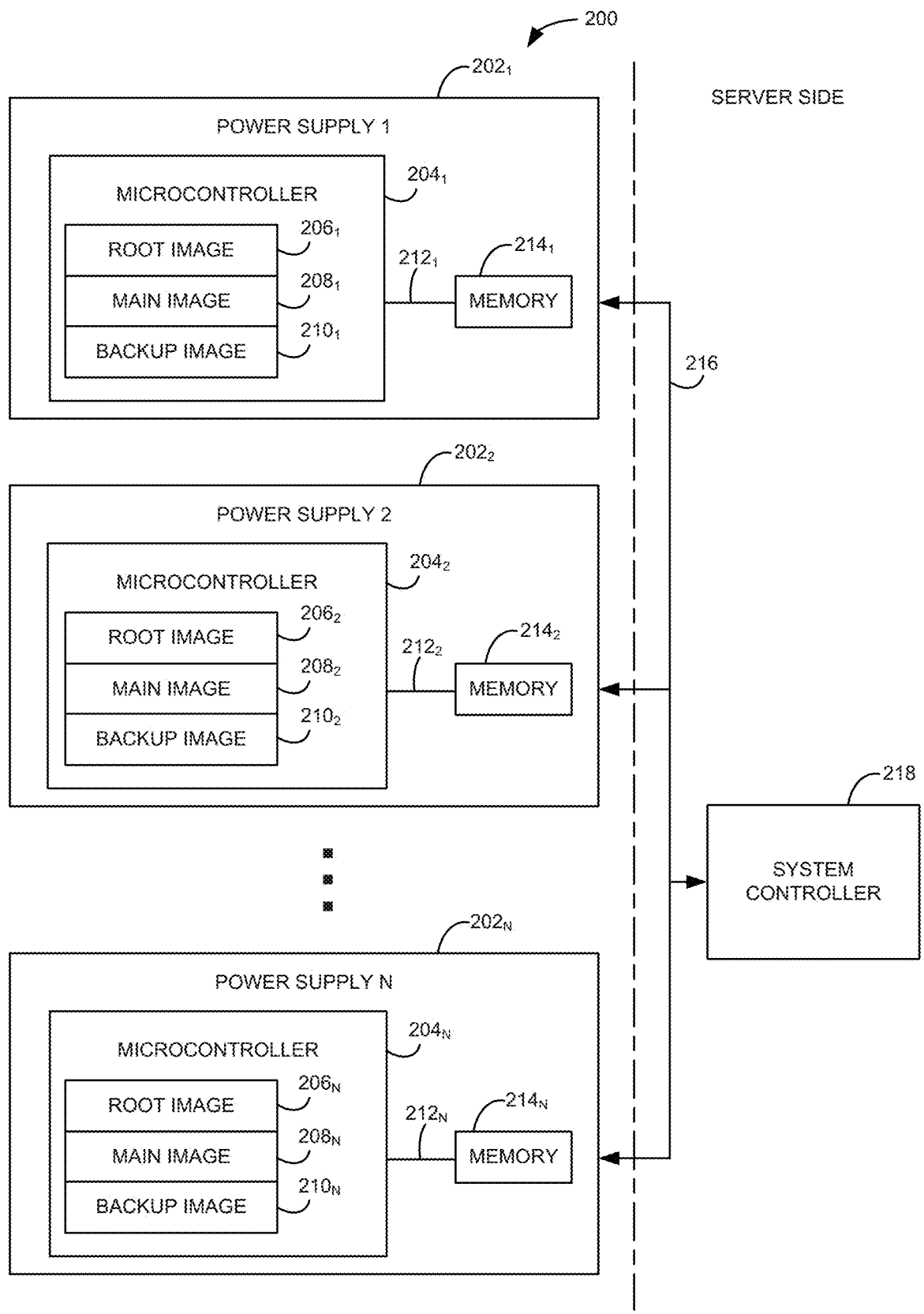
FIG. 2 is a block diagram illustrating another example of a system including redundant power supplies.

FIG. 2 is a block diagram illustrating another example of a system 200. System 200 includes a plurality of power supplies $202_1$ to $202_N$ on a power supply side of system 200, where "N" is any suitable number of power supplies, and a system controller 218 on a server side of system 200. Each power supply $202_1$ to $202_N$ includes a microcontroller $204_1$ to $204_N$ for controlling the operation and monitoring the status of each power supply $202_1$ to $202_N$, respectively.

Each microcontroller $204_1$ to $204_N$ includes a non-volatile memory storing a root image $206_1$ to $206_N$, a main image $208_1$ to $208_N$, and a backup image $210_1$ to $210_N$, respectively. The root image of each microcontroller includes machine readable instructions executed by the microcontroller to determine whether the microcontroller operates using the main image or the backup image and/or whether the microcontroller should switch from operating using the main image to operating using the backup image. The main image of each microcontroller includes machine readable instructions that may be executed by the microcontroller for operating the power supply. The main image may be updated. In one example, the backup image of each microcontroller may be the factory programmed machine readable instructions that may be executed by the microcontroller for operating the power supply. The backup image of each microcontroller may not be overwritten.

Each power supply $202_1$ to $202_N$ also includes a memory $214_1$ to $214_N$, which is used to update the main image $208_1$ to $208_N$ of each microcontroller $204_1$ to $204_N$, respectively. Each microcontroller $204_1$ to $204_N$ is electrically coupled to memory $214_1$ to $214_N$ through a communication path $212_1$ to $212_N$, respectively. Each memory $214_1$ to $214_N$ may include an electrically erasable programmable read-only memory (EEPROM) or another suitable memory.

System controller 218 controls the update of the main image $208_1$ to $208_N$ of each power supply $202_1$ to $202_N$, respectively. System controller 218 is electrically coupled to each power supply $202_1$ to $202_N$ as indicated at 216. System controller 218 receives power from each power supply $202_1$ to $202_N$ for operating system controller 218, receives status information from each power supply $202_1$ to $202_N$, and sends data and control signals to each power supply $202_1$ to $202_N$ to control the update of the main image of each power supply $202_1$ to $202_N$.

When new machine readable instructions (i.e., firmware) are available for power supplies $202_1$ to $202_N$, system controller 218 writes the new machine readable instructions to each memory $214_1$ to $214_N$. Once the new machine readable instructions are written to each memory $214_1$ to $214_N$, system controller 218 may execute a status check to verify that the new machine readable instructions written to each memory $214_1$ to $214_N$ are valid. Once system controller 218 verifies that the new machine readable instructions written to each memory $214_1$ to $214_N$ are valid, system controller 218 initiates the update of the main image $208_1$ to $208_N$ of each power supply $202_1$ to $202_N$, respectively, one at a time.

In one example, system controller 218 determines whether redundant power supplies are installed in system 200 and whether the power supplies are operational. If system controller 218 fails to identify redundant power supplies that are operational within system 200, the system controller backs up its cache to a non-volatile memory, initiates the bootloader process of the operational power supply to switch from the old image to the new image, and shuts down prior to losing power. If redundant power supplies are installed and operational in system 200 as illustrated in FIG. 2, system controller 218 initiates a bootloader process to serially update the main image $208_1$ to $208_N$ of each power supply $202_1$ to $202_N$, respectively. During the update of the main image of a power supply, the power from the bootloading power supply to system controller 218 is lost while power is maintained to system controller 218 from a redundant power supply. Each bootloading power supply transfers the new machine readable instructions from memory $214_1$ to $214_N$ to the main image $208_1$ to $208_N$, respectively.

Once the bootloading of a power supply is complete and the power supply enables its power output, system controller 218 executes a status check to confirm the power supply is executing from the main image. If the power supply is executing from the main image, the update process was successful. In one example, system controller 218 may then wait an additional time (e.g., 5 seconds) and then verify that the power supply is operating within its regulation limits. System controller 218 may then generate a log entry in the system event log indicating the success of the update process. System controller 218 then proceeds to initiate the bootload of the next power supply until all the power supplies have been updated. In one example, if a status check of a power supply fails, system controller 218 abandons the update process and generates a log entry in the system event log indicating the failure of the update process.

Figure 3:
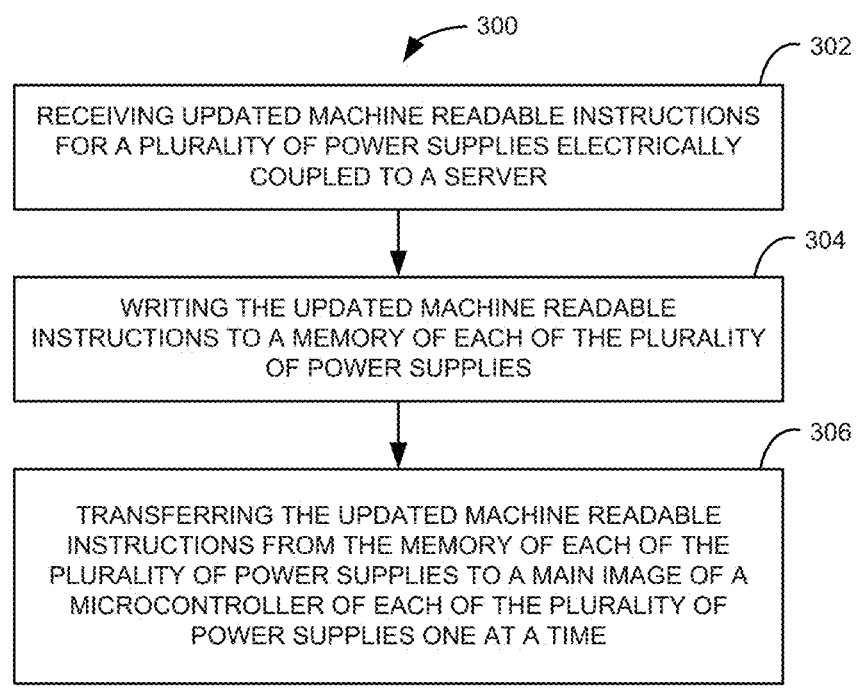
FIG. 3 is a flow diagram illustrating one example of a method for updating the machine readable instructions in a plurality of power supplies.

FIG. 3 is a flow diagram illustrating one example of a method 300 for updating the machine readable instructions in a plurality of power supplies. At 302, method 300 includes receiving updated machine readable instructions for a plurality of power supplies electrically coupled to a server. At 304, method 300 includes writing the updated machine readable instructions to a memory of each of the plurality of power supplies. At 306, method 300 includes transferring the updated machine readable instructions from the memory of each of the plurality of power supplies to a main image of a microcontroller of each of the plurality of power supplies one at a time.

In one example, method 300 further includes checking the status of each of the plurality of power supplies after transferring the machine readable instructions from the memory to the main image of the microcontroller of each of the plurality of power supplies. An event log may be generated indicating the results of the status check for each of the plurality of power supplies. In one example, the transferring of the machine readable instructions from the memory to the main image of the microcontroller of each of the plurality of power supplies may be stopped in response to the results of the status check indicating a power supply of the plurality of power supplies is not operating from the main image.

In one example, a system controller controls the writing and the transferring of the updated machine readable instructions and method 300 includes maintaining power to the system controller from at least one of the plurality of power supplies during the writing and transferring of the updated machine readable instructions. Method 300 may include maintaining power to the server from at least one of the plurality of power supplies while transferring the machine readable instructions from the memory of each of the plurality of power supplies to the main image of the microcontroller of each of the plurality of power supplies.

Figure 4:
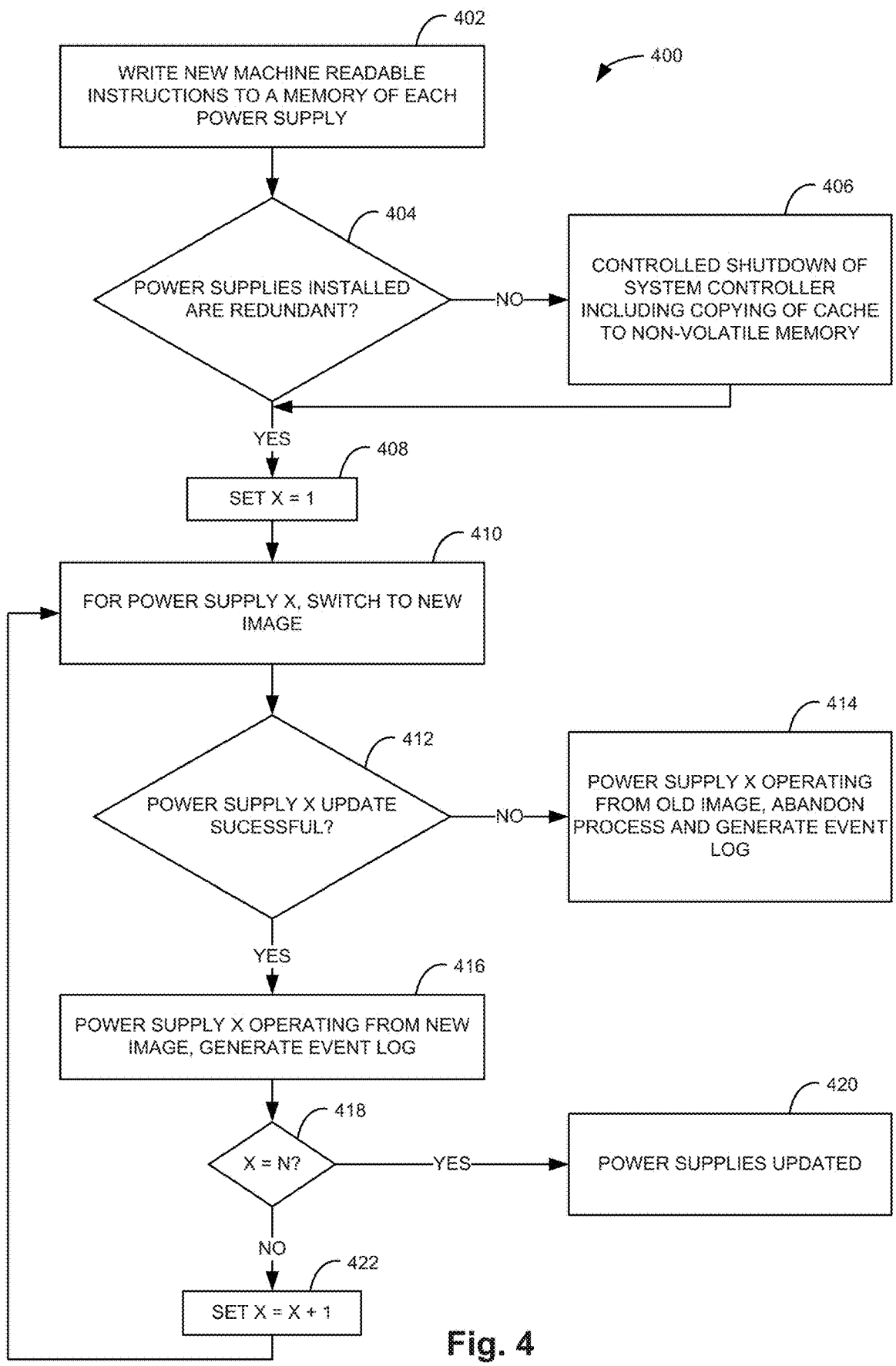
FIG. 4 is a flow diagram illustrating another example of a method for updating the machine readable instructions in a plurality of power supplies.

FIG. 4 is a flow diagram illustrating another example of a method 400 for updating the machine readable instructions in a plurality of power supplies. At 402, new machine readable instructions are written to a memory of each power supply. At 404, it is determined whether the power supplies installed are redundant. If the power supplies installed are not redundant, then at 406 a controlled shutdown of the system controller including the copying of the cache of the system controller to a non-volatile memory is performed. If the power supplies installed are redundant, or after the system controller is shut down if the power supplies installed are not redundant, at 408 "X" is set equal to 1, where "X" is a variable indicating the currently selected power supply.

At 410, power supply "X" is switched to the new image. To switch to the new image, the power output of power supply "X" is turned off and then the machine readable instructions in the memory of power supply "X" are transferred to the main image of power supply "X". The power output of power supply "X" is then turned back on. At 412, it is determined whether the update of power supply "X" was successful. If the update was not successful, then at 414 power supply "X" is operating from an old image, the update process is abandoned, and an event log indicating the failure of the update is generated. If the update was successful, then at 416 power supply "X" is operating from the new image and an event log indicating the success of the update is generated.

At 418, it is determined whether "X" equals "N", where "N" is the number of power supplies to be updated. If "X" equals "N", then at 420 the power supplies have been updated and the process is complete. If "X" does not equal "N", then at 422 "X" is set equal to "X" plus one and the process continues at 410 to update the next power supply. In this way, machine readable instructions of each power supply may be updated while the system maintains power from at least one of the power supplies.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:
1. A system comprising: a server;
a plurality of power supplies electrically coupled to the server to provide power to the server when the server is in operation, each power supply including:
a microcontroller; and machine readable instructions, for each respective power supply, executable by the microcontroller to operate the respective power supply; and a system controller disposed within the server to serially update the machine readable instructions of each of the plurality of power supplies one at a time while maintaining power to the system controller from at least one of the plurality of power supplies and not providing power from the respective power supply being updated, wherein each of the power supplies ceases supplying power while the machine readable instructions thereof are being updated, and each of the power supplies continues to supply power while the machine readable instructions of another one of the power supplies are being updated.

2. The system of claim 1, wherein:

each of the plurality of power supplies comprises a memory on which resides the respective machine readable instructions, the system controller writes updated machine readable instructions to the memory of each respective power supply, and updating the respective machine readable instructions of a given power supply of the plurality of power supplies includes initiating a transfer of the updated machine readable instructions from the memory of a given power supply to a main image of the microcontroller of the given power supply.

3. The system of claim 1, wherein the system controller verifies whether each respective power supply is operating within its regulation limits after the machine readable instructions of the corresponding power supply are updated.

4. The system of claim 1, wherein the system controller generates an event log based on the success or failure of the update of the machine readable instructions of each respective power supply.

5. The system of claim 1, wherein the machine readable instructions reside in a memory, the memory of each of the plurality of power supplies comprising an electrically erasable programmable read-only memory (EEPROM).

6. The system of claim 1, wherein:

the machine readable instructions comprise a main image of the microcontroller of the respective power supply, each of the power supplies includes a first memory that is a non-volatile memory that is part of the microcontroller and stores the main image of the microcontroller, and a second memory that is separate from and communicably connected to the microcontroller, and the system controller writes the updated machine readable instructions to the second memory and then updates the machine readable instructions of a given power supply of the plurality for power supplies by transferring the updated machine readable instructions from the first memory to the second memory of the respective power supply.

7. A system comprising:

a plurality of power supplies, each power supply comprising:
  a microcontroller; and
  a memory; and a system controller electrically coupled to each of the plurality of power supplies, the system controller to serially bootload each of the plurality of power supplies by writing updated machine readable instructions to the memory of each of the plurality of power supplies and serially initiating the transfer of the updated machine readable instructions from the memory to a main image of the microcontroller of each of the plurality of power supplies, wherein:

the system controller maintains power from at least one of the plurality of power supplies to the system controller during the transfer of the updated machine readable instructions to the main image of each respective power supply while not providing power to the system controller from the respective power supply being updated, each of the power supplies ceases supplying power while the machine readable instructions thereof are being updated, and each of the power supplies continues to supply power while the machine readable instructions of another one of the power supplies are being updated.

8. The system of claim 7, wherein a power output of each of the plurality of power supplies is shut off prior to the transfer of the updated machine readable instructions to the main image of the microcontroller of each respective power supply.

9. The system of claim 7, wherein the memory of each of the plurality of power supplies comprises an electrically erasable programmable read-only memory (EEPROM).

10. The system of claim 7, wherein the microcontroller of each of the plurality of power supplies comprises a root image and a backup image.

11. The system of claim 7, wherein:

further comprising machine readable instructions, for each respective power supply, executable by the microcontroller to operate the respective power supply, the machine readable instructions comprising a main image of the microcontroller of the respective power supply, each of the power supplies includes a first memory that is a non-volatile memory that is part of the microcontroller and stores the main image of the microcontroller, and a second memory that is separate from and communicably connected to the microcontroller, and the system controller writes the updated machine readable instructions to the second memory and then updates the machine readable instructions of a given power supply of the plurality for power supplies by transferring the updated machine readable instructions from the first memory to the second memory of the respective power supply.

12. A method comprising:

receiving updated machine readable instructions for a plurality of power supplies electrically coupled to a server;

writing the updated machine readable instructions to a memory of each of the plurality of power supplies;

transferring the updated machine readable instructions from the memory of each of the plurality of power supplies to a main image of a microcontroller of each respective power supply one at a time; and maintaining power to a system controller, the system controller being disposed within the server, from at least one of the plurality of power supplies during the writing and transferring while not providing power from the respective power supply being updated, wherein:

the system controller controls the writing and the transferring, each of the power supplies ceases supplying power while the machine readable instructions thereof are being updated, and each of the power supplies continues to supply power while the machine readable instructions of another one of the power supplies are being updated.

13. The method of claim 12, further comprising:

checking the status of each of the plurality of power supplies after transferring the machine readable instructions from the memory to the main image of the microcontroller of each respective power supply; and generating an event log indicating results of the status check for each of the plurality of power supplies.

14. The method of claim 12, further comprising:

checking the status of each of the plurality of power supplies after transferring the machine readable instructions from the memory to the main image of the microcontroller of each respective power supply; and stopping the transferring in response to the results of the status check indicating a power supply of the plurality of power supplies is not operating from the main image for the respective power supply.

15. The method of claim 12, further comprising: maintaining power to the server from at least one of the plurality of power supplies while transferring the machine readable instructions from the memory of each respective power supply to the main image of the microcontroller of each respective power supply.

\* \* \* \* \*